United States Patent
Chang et al.

(10) Patent No.: US 7,660,571 B2
(45) Date of Patent: Feb. 9, 2010

(54) PROGRAMMABLE ATTENUATOR USING DIGITALLY CONTROLLED CMOS SWITCHES

(75) Inventors: Sung-Hsien Chang, Irvine, CA (US); Ramon Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 455 days.

(21) Appl. No.: 11/588,264

(22) Filed: Oct. 27, 2006

(65) Prior Publication Data
US 2007/0105517 A1 May 10, 2007

Related U.S. Application Data

(60) Provisional application No. 60/733,253, filed on Nov. 4, 2005.

(51) Int. Cl.
*H04B 1/26* (2006.01)

(52) U.S. Cl. .................... 455/324; 333/81 R
(58) Field of Classification Search .............. 455/232.1, 455/234.1, 239.1, 249.1, 254, 307, 324; 331/81 R, 331/139, 146
See application file for complete search history.

(56) References Cited

U.S. PATENT DOCUMENTS 6,285,865 B1 * 9/2001 Vorenkamp et al. .......... 455/307
6,549,763 B1 * 4/2003 Imai et al. ................ 455/249.1

\* cited by examiner

*Primary Examiner*—Thanh C Le
(74) *Attorney, Agent, or Firm*—Sterne, Kessler, Goldstein & Fox, P.L.L.C.

(57) ABSTRACT

A programmable attenuator includes a resistor ladder having a plurality of taps to provide a coarse gain control. Coupled to each tap is a plurality of switches. Control logic activates or deactivates individual switches in the plurality of switches to provide a fine gain control. More specifically, a set of activated switches provides fine gain control by determining an overall attenuation level interpolated between an adjacent pair of taps.

23 Claims, 6 Drawing Sheets

PROGRAMMABLE ATTENUATOR USING DIGITALLY CONTROLLED CMOS SWITCHES

CROSS-REFERENCE TO RELATED APPLICATIONS

This application claims the benefit of U.S. Provisional Patent Application No. 60/733,253, filed Nov. 4, 2005, entitled "A Programmable Attenuator Using Digitally Controlled Switches," which is incorporated by reference herein in its entirety.

BACKGROUND OF THE INVENTION

1. Field of the Invention

The present invention is related to a programmable attenuator.

2. Background Art

Communication systems allow for communication over large distances by using sophisticated transponders in a satellite. Transponders receive incoming communications over a band of frequencies, the uplink, and retransmit the communications over another band of frequencies, the downlink, at the same time.

The uplink originates from a point on surface of the Earth, usually a ground station, to the transponder. A receiver in the transponder receives the incoming communication during the uplink. The transponder sends the downlink to a point or region on the surface of the Earth, usually to one or more ground stations or receivers. Separate receivers located on the surface of the Earth receive the retransmission of the communication during the downlink.

The receiver in the transponder, as well as the receivers located on the surface of the Earth, may be implemented as either a heterodyne receiver or a homodyne receiver, also called a direct-conversion receiver. A receiver constructed using a heterodyne architecture down-convert the received communication into a much lower frequency, also called an intermediate frequency (IF). The down-conversion process in the heterodyne architecture generates images of the communication. The most common approach to suppressing the images is through the use of an image reject front-end filter. On the other hand, direct-conversion receivers down-convert the received communication to baseband thereby eliminating the need for IF stages and the image-rejection requirement of front-end filters. As a result, direct-conversion can significantly improve the on-chip integration of a receiver.

Implementing a direct-conversion tuner for satellite broadcasting is challenging due to wide input signal bandwidths (e.g., ranging from 950~2150 MHz) and low received power levels (e.g., ranging from −25~−70 dBm). In addition, due to the many broadcasting channels and satellites, Digital Broadcasting System (DBS) receivers must contend with large numbers of unwanted channel interferers. Consequently, the radio frequency (RF) and the baseband attenuators of a DBS tuner should exhibit good linearity over a wide tuning range to enable the DBS tuner to achieve high channel-selectivity.

BRIEF DESCRIPTION OF THE DRAWINGS/FIGURES

The accompanying drawings, which are incorporated in and constitute part of the specification, illustrate embodiments of the invention and, together with the general description given above and the detailed description of the embodiment given below, serve to explain the principles of the present invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the appended claims define the scope of the invention.

Figure 1:
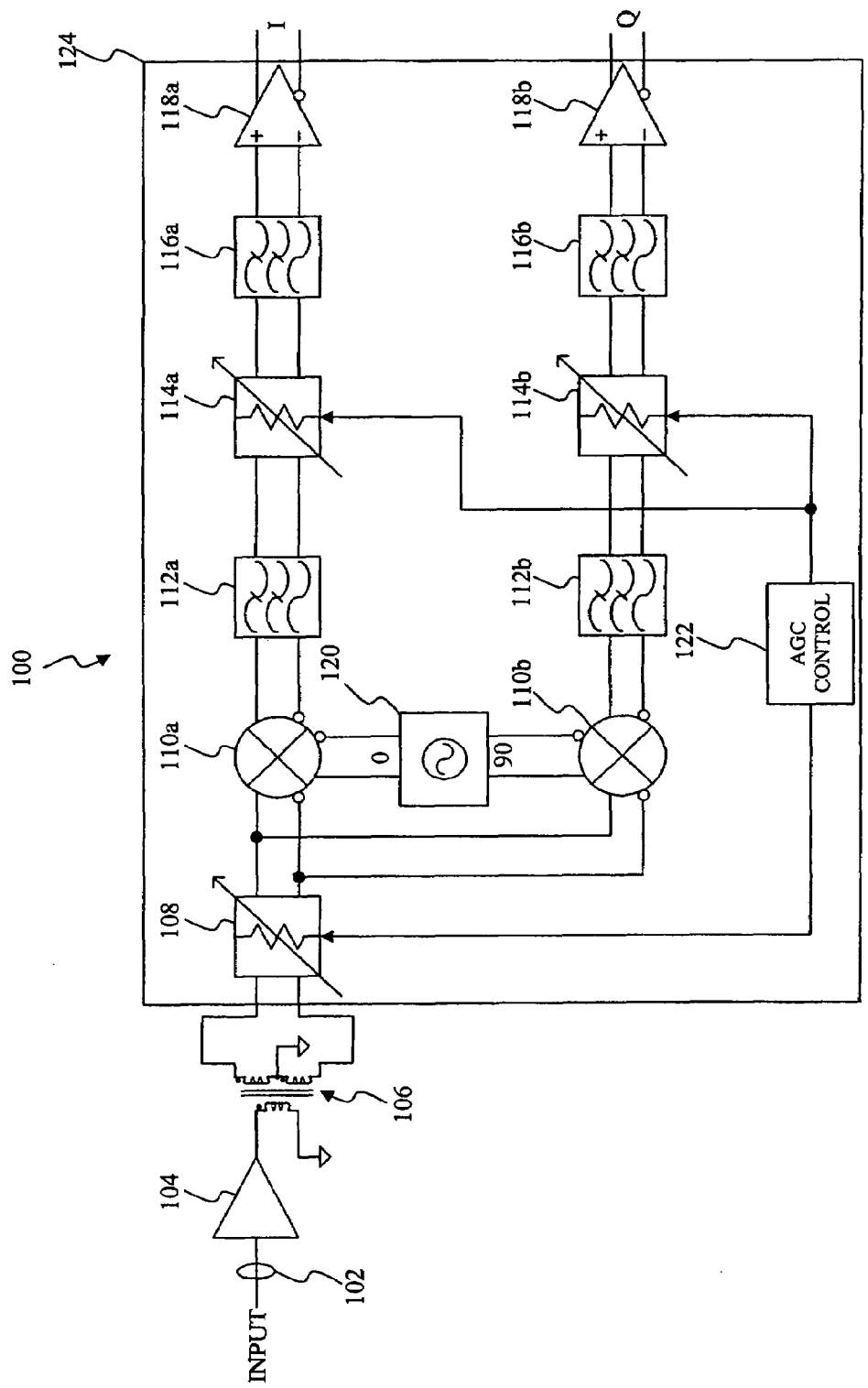
FIG. 1 illustrates a direct-conversion tuner having a programmable attenuator according to an exemplary embodiment of the present invention.

FIG. 1 illustrates a direct-conversion receiver having a programmable attenuator according to an exemplary embodiment of the present invention. Direct conversion receiver 100 may receive an input, denoted as input 102, from an antenna or any other suitable source. Direct conversion receiver 100 down-converts input 102 directly to baseband in a single downconversion. By directly translating input 102 to baseband, direct conversion receiver 100 eliminates intermediate frequency (IF) stages and the image-rejection requirement of front end filters. As a result, direct-conversion can significantly improve the on-chip integration of a receiver. For example, as shown in FIG. 1, the components located within box 124 may be implemented on an integrated circuit (IC) chip, while those components located outside of box 124, namely LNA 104 and balun 106, can be implemented external to the integrated circuit chip.

Low Noise Amplifier (LNA) 104 is a single-ended amplifier that amplifies input 102. Connected to LNA 104 is a balanced-unbalanced network (balun) 106 to convert input 102 to a differential signal. Even though balun 106 converts input 102 into a differential signal, those skilled in the art will recognize that input 102 may remain a single ended signal by directly connecting LNA 104 to programmable attenuator 108. In an exemplary embodiment, balun 106 uses a transformer with the unbalanced connection, i.e., the differential connection, made to one winding and the balanced connection, i.e., the single-ended connection, to the other winding.

Programmable attenuator 108 attenuates the signal from balun 106 according to an automatic gain control (AGC) feedback loop 122. To achieve constant settling time for AGC feedback loop 122, programmable attenuator 108 uses a linear-in-dB gain control. At the maximum gain setting, programmable attenuator 108 provides low distortion and low noise. Programmable attenuator 108 also provides a wide gain range with fine gain resolution to maintain a high signal-to-noise ratio over a wide range of input levels. In an exemplary embodiment, programmable attenuator 108 has a 30 dB gain range with a resolution substantially less than 1 dB to maintain a high signal-to-noise ratio. Additionally, programmable attenuator 108 contains enough bandwidth to cover the frequency range of input 102. In an exemplary embodiment, input 102 is located within the satellite band, approximately ranging from 950 MHz to 2150 MHz. Accordingly, the bandwidth of the programmable attenuator 108 is sufficient to cover this frequency range.

Mixer 110a and 110b (herein 110), connect to the output of programmable attenuator 108. Mixer 110 in conjunction with local oscillator 120 down converts the output of programmable attenuator 108 to baseband. For frequency and phase modulated input signals, direct conversion receiver 100 may produce quadrature outputs so as to avoid loss of information as shown in FIG. 1. More specifically, a first output of local oscillator 120 is substantially the same frequency as input 102 while a second output of local oscillator 120 is phase shifted 90 degrees from the first output. Mixer 110a produces an in phase signal by down-converting the output of programmable attenuator 108 to baseband using the first output of local oscillator 120. This signal produced from down-converting the output of programmable attenuator 108 is in phase with the first signal of local oscillator 120. Mixer 110b produces a quadrature phase signal by down-converting the output of programmable attenuator 108 to baseband using the second output of local oscillator 120. This signal produced from down-converting the output of programmable attenuator 108 is phase shifted approximately 90 degrees from the first signal of local oscillator 120.

Low pass filter 112a and 112b (herein 112) suppresses out-of-channel interference from the in phase signal and the quadrature phase signal respectively. For example, adjacent communication channels may cause out-of-channel interference. Low pass filter 112 further connects to programmable attenuator 114.

Programmable attenuator 114 contains programmable attenuator 114a and programmable attenuator 114b (herein 114) to attenuate the in phase signal and the quadrature phase signal respectively. Programmable attenuator 114 uses a linear-in-dB gain control to achieve constant settling time for AGC feedback loop 122. Programmable attenuator 114 also provides a wide gain range with fine gain resolution to maintain a high signal-to-noise ratio over a wide range of input levels. In an exemplary embodiment, programmable attenuator 114 has a 30 dB gain range with a resolution substantially less than 1dB to maintain a high signal-to-noise ratio. At the maximum gain setting, programmable attenuator 114 provides low distortion and low noise. As well as providing a wide gain range with fine gain resolution, programmable attenuator 114 contains sufficient bandwidth to cover the frequency range of input 102.

Low pass filter 116a and 116b (herein 116) suppresses out-of-channel interference from differential in phase signal and differential quadrature phase signal respectively. After low pass filter 116, LNA 118a amplifies the in phase signal to produce an in phase output, denoted as I, and LNA 118a amplifies the differential quadrature phase signal to produce a differential quadrature phase output, denoted as Q.

Figure 2:
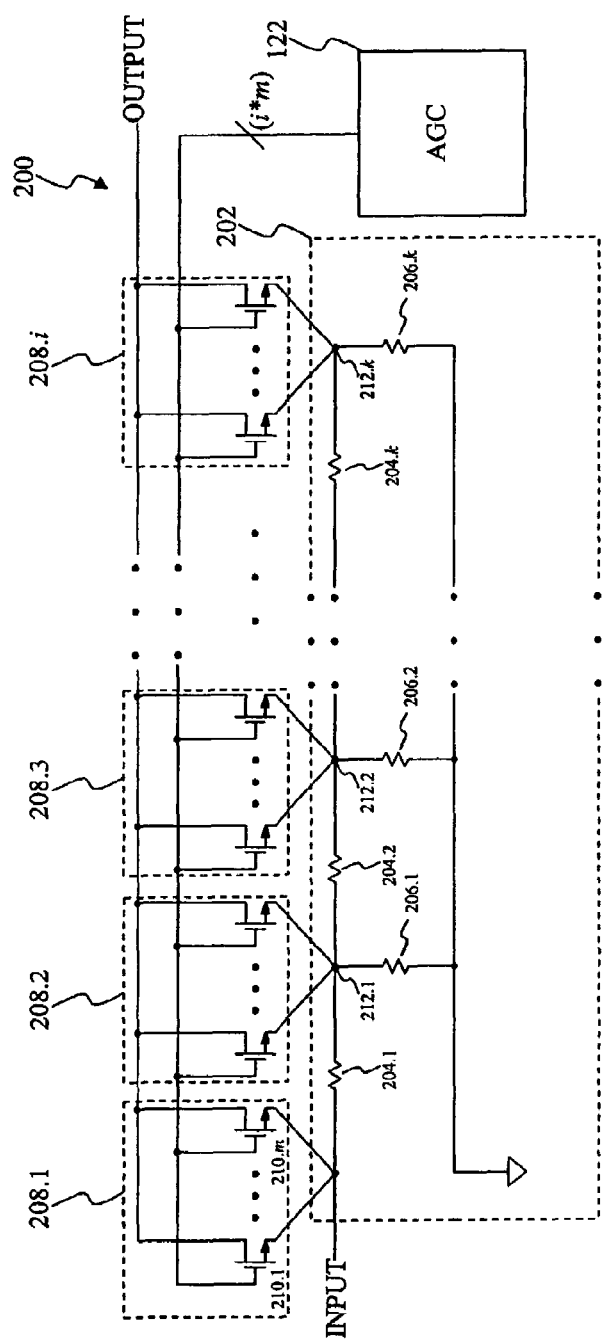
FIG. 2 illustrates a block diagram of a programmable attenuator according to an exemplary embodiment of the present invention.

FIG. 2 illustrates a block diagram of a programmable attenuator according to an exemplary embodiment of the present invention. Direct conversion receiver 100, as illustrated in FIG. 1, may use this exemplary embodiment to implement either programmable attenuator 108 or programmable attenuator 114.

As shown in FIG. 2, programmable attenuator 200 includes a resistor ladder 202, a parallel switch bank 208, and AGC feedback loop 122. Resistor ladder 202 attenuates an input, denoted as INPUT, to generate an attenuated output, denoted as OUTPUT. Herein, a reference to an element without a suffix corresponds to the collective grouping of that element. For example, a reference to 204 corresponds to elements 204.1 through 204.k. A reference to an element with a suffix corresponds to that element. For example, a reference to 204.1 refers to element 204.1 only.

A resistor ladder uses repetitive arrangements of precision resistor networks in a ladder-like configuration. Resistor ladder 202 comprises k series resistors 204.1 through 204.k arranged in series and k shunt resistors 206.1 through 206.k connected to each series resistor 204. For example, shunt resistor 206.1 connects to series resistor 204.1 and shunt resistor 206.2 connects to series resistor 204.2. In an exemplary embodiment, shunt resistor 206 is approximately twice the value of series resistor 204 to form an R-2R resistor ladder. Each shunt resistor 206 further connects to ground.

The junction connecting an individual shunt resistor 206 to a corresponding series resistor 204 forms tap 212. Tap 212 comprises k taps 212.1 through 212.k with each tap corresponding to a junction between the corresponding series resistor 204 and the corresponding shunt resistor 206. In other words, for a resistor ladder 202 with k shunt resistors 206, there are k taps. Each tap corresponds to a connection between the individual series resistor 204 and the corresponding shunt resistor 206. For example, the junction connecting series resistor 204.1 and shunt resistor 206.1 forms tap 212.1.

Each tap 212 of resistor ladder 202 is spaced apart by a set tap attenuation amount. In an exemplary embodiment, individual taps 212 of resistor ladder 202 are spaced a few decibels apart from adjacent taps to provide coarse attenuation. In other words, the attenuation at tap 212.k is approximately a few decibels greater than the attenuation at tap 212.(k−1), the previous tap.

To achieve a very fine gain resolution, each tap 212 of the resistor ladder 202 further connects to a corresponding parallel switch bank 208. Switch bank 208 interpolates the attenuation level provided by adjacent taps. In other words, parallel switch bank 208 further divides the coarse attenuation of resistor ladder 202. In an exemplary embodiment, switch bank 208 may interpolate a range of approximately 30 dB into fine attenuation steps of less than 1 dB.

Parallel switch bank 208 comprises i parallel switch banks 208.1 through 208.i. In an another exemplary embodiment, the number of resistors in series resistor 204 and the number of resistors in shunt resistor 206 is one less than the number of parallel switch banks in parallel switch bank 208. In this exemplary embodiment, a first parallel switch bank, denoted as 208.1 in FIG. 2, is connected directly to the input. The remaining parallel switch banks 208.2 through 208.i connect to a corresponding tap on resistor ladder 202. For example, tap 212.1 on resistor ladder 202, formed by series resistor 204.1 and shunt resistor 206.1, connects to parallel switch bank 208.2. Those skilled in the arts will recognize that an individual tap 212.1 through 212.k is not required to connect to a corresponding parallel switch bank 208. In this case, a tap 212 without a corresponding parallel switch bank 208 may provide coarse attenuation only.

Each parallel switch bank 208 further comprises m parallel switching transistors 210.1 through 210.m. In an exemplary embodiment, programmable attenuator 200 has a total of m*i parallel switching transistors 210, where m is the number of transistors in parallel switching transistor 210, and i represents the number of parallel switch banks 208 in programmable attenuator 200. In another exemplary embodiment, each parallel switch bank 208 may comprise differing numbers of parallel switching transistors 210. For example, parallel switch bank 208.1 may include parallel switching transistor 210.1 and parallel switch bank 208.2 may include parallel switching transistors 210.1 through 210.3. Parallel switching transistor 210 may be implemented in complementary metal oxide (CMOS) technology.

To achieve very fine gain resolution, programmable attenuator 200 uses the associated switch resistance of parallel switching transistor 210. In an exemplary embodiment, each of the parallel switching transistors 210.1 through 210.$m$ has a resistance in the order of kilohms. To provide for large bandwidth, programmable attenuator 200 may use small-valued resistors for resistor ladder 202 and small-sized parallel switching transistors 210 having low parasitic capacitance.

Each individual transistor in parallel switching transistor 210 has its respective source coupled to a corresponding tap on resistor ladder 202. For example, parallel switching transistors 210.1 through 210.$m$ of parallel switch bank 208.2 have their respective sources connected to tap 212.1. In addition, each individual transistor in parallel switching transistor 210 has its respective drain coupled to the output of programmable attenuator 200. Finally, each individual transistor in parallel switching transistor 210 has its respective gate coupled to an output of automatic gain control feedback loop 122. With their gates fully turned on, parallel switching transistors 210 behave as linear resistors. Therefore, any given register/gain/attenuation setting may achieve very low harmonic distortion.

During operation of programmable attenuator 200, AGC feedback loop 122 independently controls the individual parallel switching transistors 210.1 through 210.$m$ within parallel switch banks 208.1 through 208.$i$ using m*i control lines. More specifically, a register within the control logic circuit of the AGC feedback loop 122 generates a control word for the AGC feedback loop 122. The control logic circuit generates a m*i bit code word from the control word to individually control each of the parallel switching transistors 210.1 through 210.$m$ in each of the parallel switch bank 208.1 through 208.$i$. In an exemplary embodiment, AGC feedback loop 122 uses an 8 bit control word generated by the register to create a 256 bit code to control parallel switching transistors 210. In another exemplary embodiment, AGC feedback loop 122 contains additional control lines to measure the magnitude of OUTPUT. In this embodiment, AGC feedback loop 122 may adjust OUTPUT by controlling parallel switching transistors 210.1 through 210.$m$ in parallel switch bank 208.1 through 208.$i$.

Figure 3:
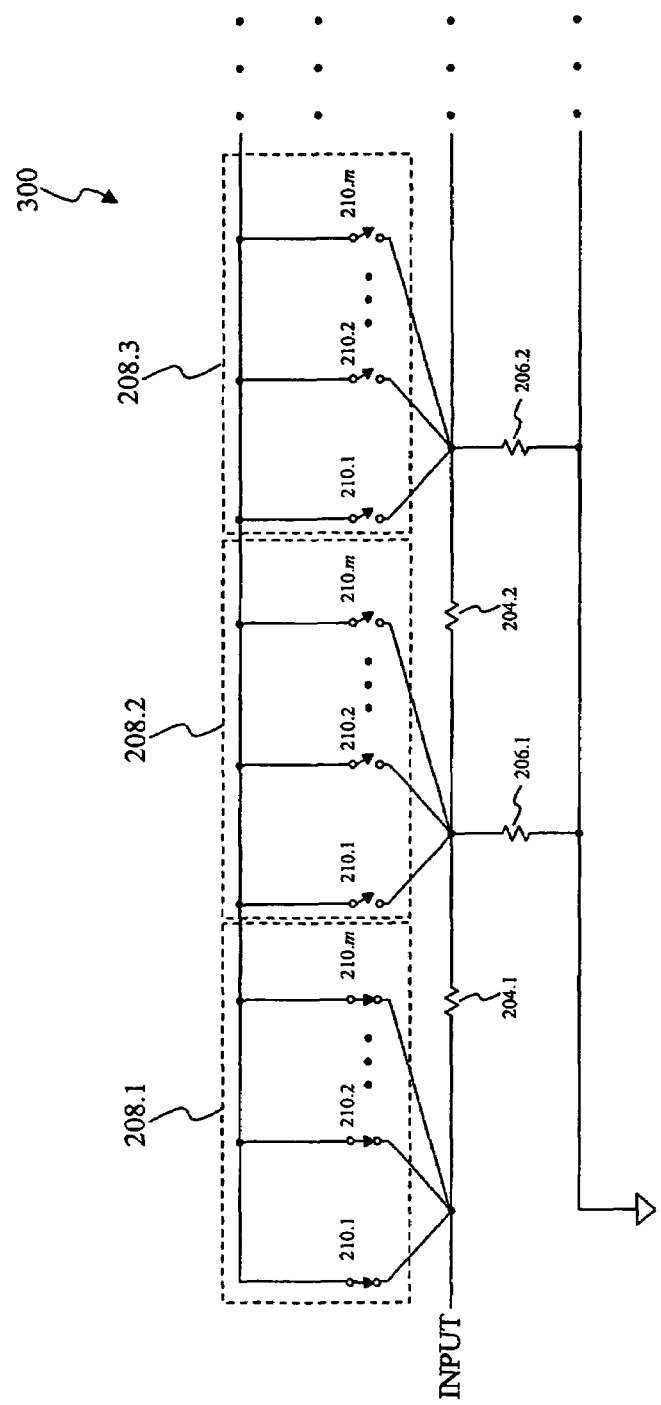
FIG. 3 illustrates a block diagram of a programmable attenuator configured to provide minimum attenuation according to an exemplary embodiment of the present invention.

FIG. 3 illustrates a block diagram of a programmable attenuator configured to provide minimum attenuation according to an exemplary embodiment of the present invention. As shown in FIG. 3, programmable attenuator 300 represents a section of programmable attenuator 200 and includes series resistors 204.1 and 204.2, shunt resistors 206.1 and 206.2, and parallel switch banks 208.1 through 208.3. Each parallel switch bank 208.1 through 208.3 further comprises m parallel switching transistors 210.1 through 210.$m$.

Programmable attenuator 300 provides minimum attenuation when the register of the AGC feedback loop 122 is set to its least significant bit (LSB). When the register of the AGC feedback loop 122 is set to its LSB, the AGC feedback loop 122 activates the m parallel switching transistors 210.1 through 210.$m$. of parallel switch bank 208.1 and deactivates the m parallel switching transistors 210.1 through 210.$m$. of parallel switch banks 208.2 through 208.$i$. More specifically, the register within the control logic circuit of the AGC feedback loop 122 generates a control word set to its least significant bit (LSB). The control logic circuit generates a bit code word from the control word to activate or turn on the m transistors in parallel switch bank 208.1 and deactivate or turn off the m transistors in parallel switch banks 208.2 through 208.$i$. As a result, only the m parallel switching transistors 210.1 through 210.$m$. of parallel switch bank 208.1 contribute to the output of programmable attenuator 300.

Figure 4:
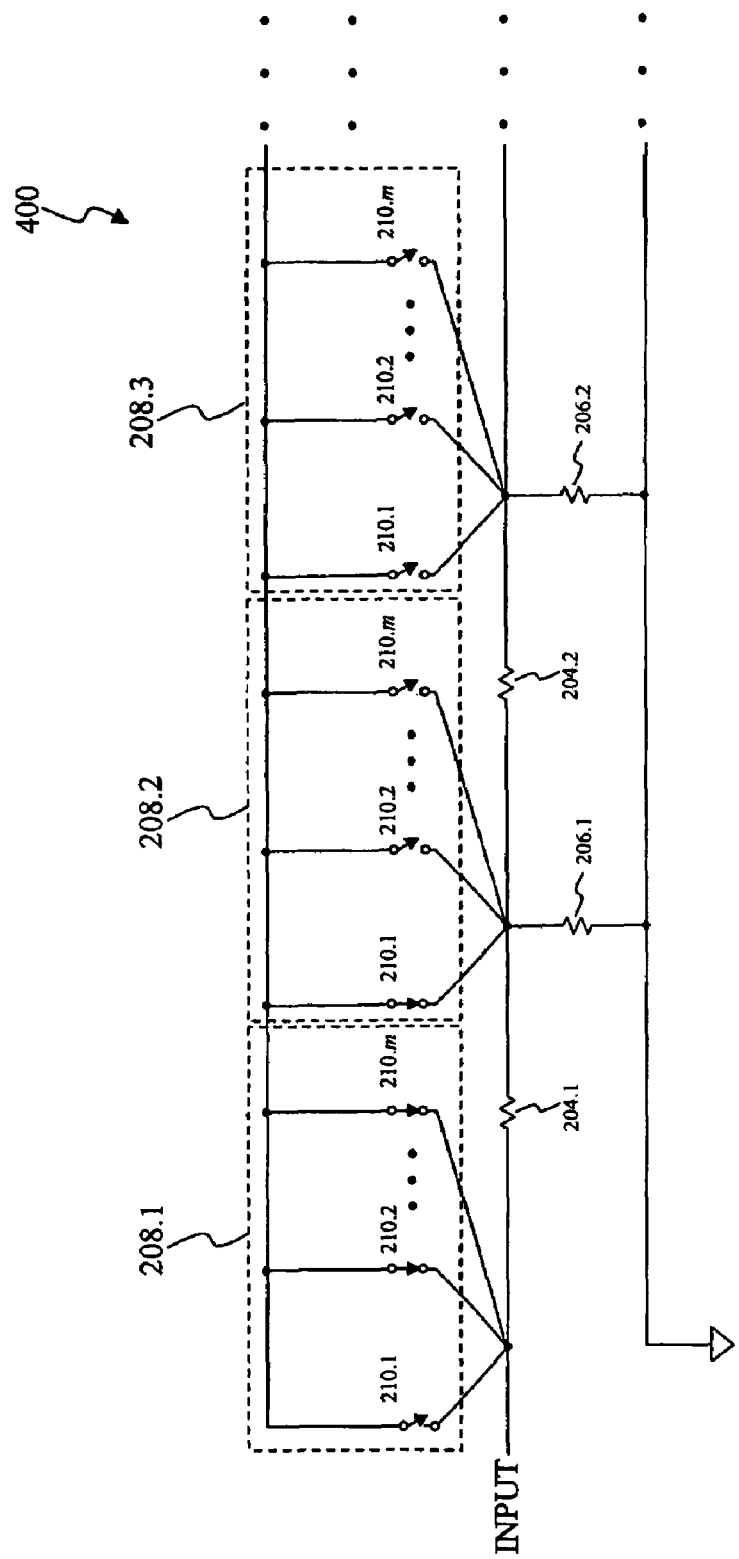
FIG. 4 illustrates a block diagram of a programmable attenuator configured to provide attenuation according to an exemplary embodiment of the present invention.

When the register of the AGC feedback loop 122 is incremented by one from its LSB setting, the AGC feedback loop 122 partially switches on parallel switch bank 208.2 as shown in FIG. 4. More specifically, the register within the control logic circuit of the AGC feedback loop 122 generates a control word set to one from its LSB. The control logic circuit generates a bit code word from the control word to activate or turn on parallel switching transistors 210.2 through 210.$m$. in parallel switch bank 208.1 and parallel switching transistor 210.1 in parallel switch bank 208.2 and deactivates or turns off the remainder of the parallel switching transistors. As a result, only the parallel switching transistors 210.2 through 210.$m$. of parallel switch bank 208.1 and parallel switching transistor 210.1 of parallel switch bank 208.2 contribute to the output of programmable attenuator 300. The attenuation provided by programmable attenuator 300 shown in FIG. 3 is less than the attenuation provided by programmable attenuator 400.

In general, to decrease attenuation, programmable attenuator 200, as shown in FIG. 2, incrementally advances the set of activated switches from a tap providing more attenuation to a tap providing less attenuation. To increase attenuation, programmable attenuator 200 incrementally advances the set of activated switches from the tap providing less attenuation to the tap providing more attenuation. The register of the AGC feedback loop 122 may be incremented in a similar manner for other attenuation settings until the register of the AGC feedback loop 122 is set to its most significant bit (MSB) as shown in FIG. 5.

Figure 5:
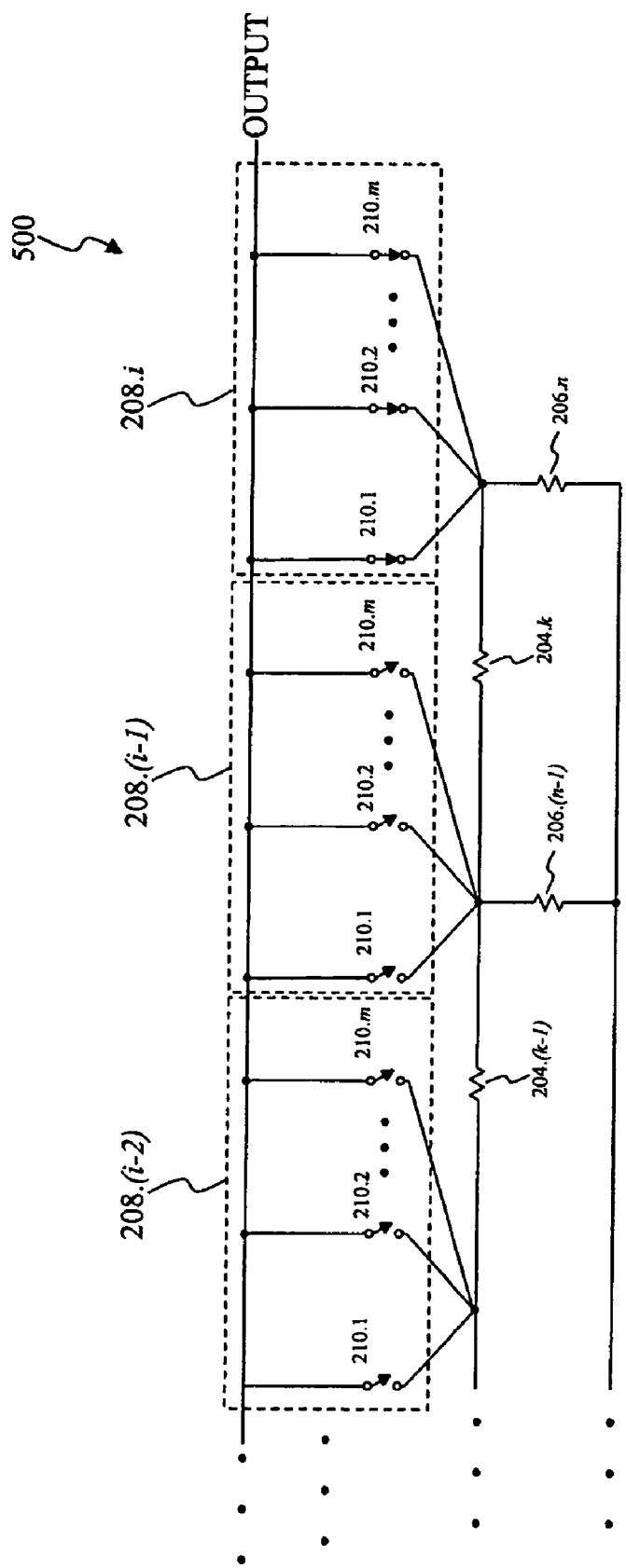
FIG. 5 illustrates a block diagram of a programmable attenuator configured to provide maximum attenuation according to an exemplary embodiment of the present invention.

FIG. 5 illustrates a block diagram of a programmable attenuator configured to provide maximum attenuation according to an exemplary embodiment of the present invention. As shown in FIG. 5, programmable attenuator 500 represents a section of programmable attenuator 200 and includes series resistor 204.$k$ and 204.($k$–1), shunt resistor 206.n and 206.($n$–1), and parallel switch banks 208.($i$–2), 208.($i$–1) and 208.$i$. Each parallel switch bank 208.($i$–2), 208.($i$–1), and 208.$i$ further comprises m parallel switching transistors 210.1 through 210.$m$.

Programmable attenuator 300 provides maximum attenuation when the register of the AGC feedback loop 122 is set to its most significant bit (MSB). When the register of the AGC feedback loop 122 is set to its MSB, the AGC feedback loop 122 activates the m parallel switching transistors 210.1 through 210.$m$. of parallel switch bank 208.$i$ and deactivates the m parallel switching transistors 210.1 through 210.($i$–1) of parallel switch banks 208.1 through 208.($i$.–1) More specifically, the register within the control logic circuit of the AGC feedback loop 122 generates a control word set to its most significant bit (MSB). The control logic circuit generates a bit code word from the control word to activate or turn on the m transistors in parallel switch bank 208.$i$ and deactivate or turn off the m transistors in parallel switch banks 208.1 through 208.($i$–1). As a result, only the m parallel switching transistors 210.1 through 210.$m$. of parallel switch bank 208.$i$ contribute to the output of programmable attenuator 300.

Figure 6:
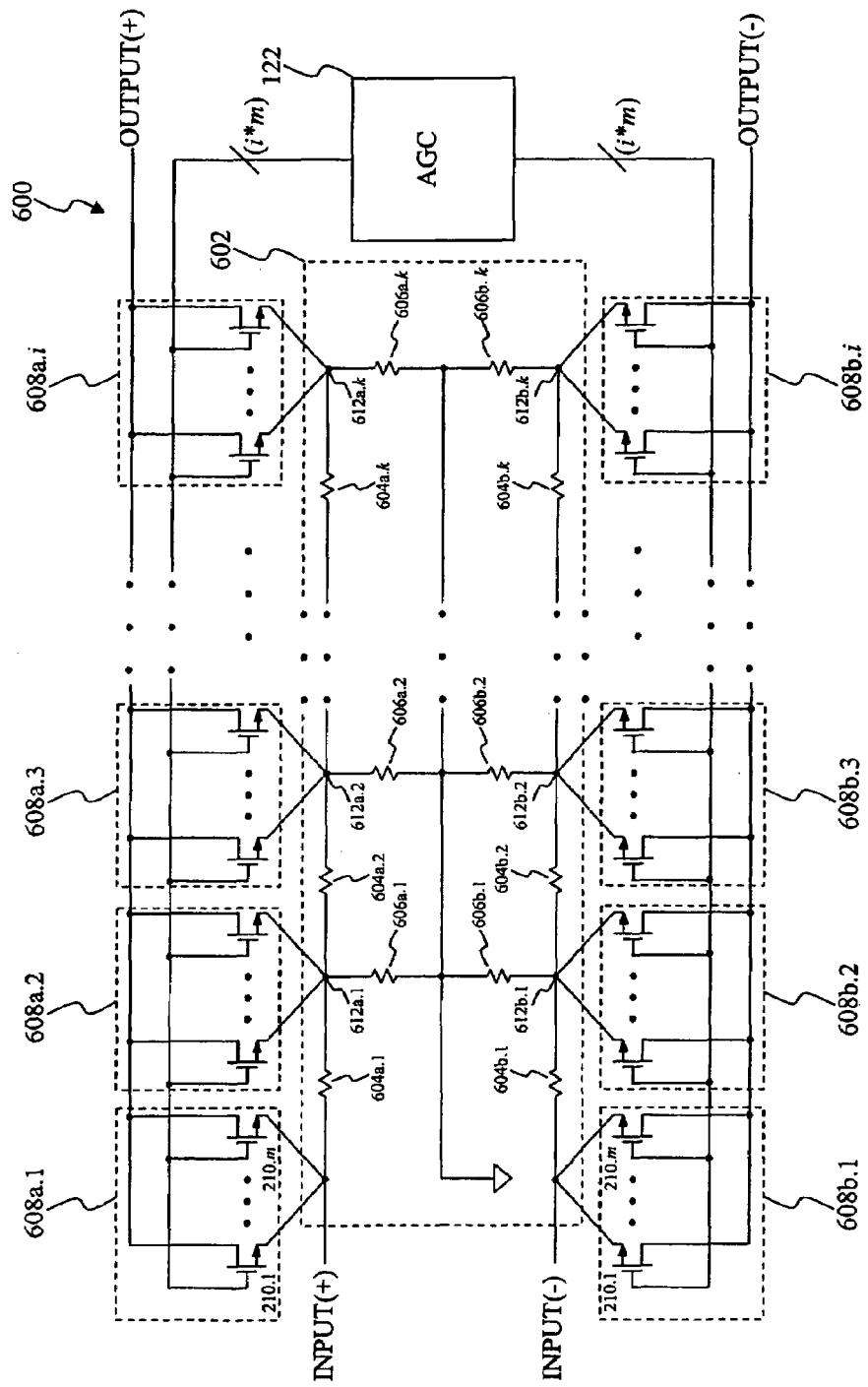
FIG. 6 illustrates a block diagram of a differential programmable attenuator according to an exemplary embodiment of the present invention.

FIG. 6 illustrates a block diagram of a differential programmable attenuator according to an exemplary embodiment of the present invention. Direct conversion receiver 100, as illustrated in FIG. 1, may use this exemplary embodiment to implement either programmable attenuator 108 or programmable attenuator 114.

As shown in FIG. 6, programmable attenuator 600 includes a resistor ladder 602, a parallel switch bank 608, and AGC feedback loop 622. Resistor ladder 602 attenuates a differential input, INPUT(+) and INPUT(−), to generate an attenuated differential output, OUTPUT(+) and OUTPUT(−).

Resistor ladder 602 comprises 2*k series resistors 604a.1 through 604a.k and 604b.1 through 604b.k arranged in series and 2*k shunt resistors 606a.1 through 606a.k and 606b.1 through 606b.k connected to each series resistor 604. For example, shunt resistor 606a.1 connects to series resistor 604a.1 and shunt resistor 606b.1 connects to series resistor 604b.1. In an exemplary embodiment, shunt resistor 606 is approximately twice the value of series resistor 604 to form an R-2R resistor ladder. Each shunt resistor 606a and 606b further connects to ground. In another exemplary embodiment, instead of ground, each shunt resistor 606 further connects to a virtual ground formed in between the complementary shunt resistors 606a and 606b. In other words, instead of further connecting shunt resistor 606a to ground, a virtual ground forms when shunt resistor 606a connects directly to shunt resistor 606b.

The junction connecting an individual shunt resistor 606 to a corresponding series resistor 604 forms tap 612. Tap 612 comprises 2*k taps 612a.1 through 612a.k and 612b.1 through 612b.k with each tap corresponding to the junction between a corresponding series resistor 604 and a corresponding shunt resistor 606. In other words, for a resistor ladder 602 with 2*k shunt resistors 606; there are 2*k taps, each tap corresponds to the connection between an individual series resistor 604 and a corresponding shunt resistor 606. For example, the junction connecting series resistor 604a.1 and shunt resistor 606a.1 forms tap 612a.1 while the junction connecting series resistor 604a.1 and shunt resistor 606b.1 forms tap 612b.1

Parallel switch bank 608 comprises 2*i parallel switch banks 608a.1 through 608a.i and 608b.1 through 608b.i. In another exemplary embodiment, the number of resistors in series resistor 604 and the number of resistors in shunt resistor 606 is two less than the number of parallel switch banks in parallel switch bank 608. In this exemplary embodiment, a first parallel switch bank, denoted as 608a.1, connects directly to INPUT(+) and a second parallel switch bank, denoted as 608b.1, connects directly to INPUT(−). The remaining parallel switch banks 608a.2 through 608a.i and 608b.2 through 608b.i connect to a corresponding tap on resistor ladder 602. For example, tap 612a.1 on resistor ladder 602, formed by series resistor 604a.1 and shunt resistor 606a.1, connects to parallel switch bank 608a.2. Those skilled in the arts will recognize tap 612 is not required to connect to a corresponding parallel switch bank 608. In this case, a tap 612 without a corresponding parallel switch bank 608 provides coarse attenuation only.

Each parallel switch bank 608a and each parallel switch bank 608b further comprises m parallel switching transistors 210.1 through 210.m. Therefore, programmable attenuator 600 has a total of 2*m*i parallel switching transistors 210, where m is the number of transistors in parallel switching transistor 210, and i represents the number of parallel switch banks 608 in programmable attenuator 600.

In an exemplary embodiment, programmable attenuator 600 substantially attenuates INPUT(+) and INPUT(−) by an equivalent amount. In other words, those components which attenuate INPUT(+) are symmetrical to those components which attenuated INPUT(−). For example, 604a.1 and 604b.1 are substantially identical. Those skilled in the arts will recognize that programmable attenuator 600 need not be symmetrical INPUT(+) may be attenuated a different amount from INPUT(−).

Programmable attenuator 600 operates in a similar manner to programmable attenuator 200. Programmable attenuator 600 interpolates the coarse gain between adjacent taps to provide fine gain resolution according to a control word generated by the register of AGC feedback loop 122. Programmable attenuator 600 provides minimum attenuation when the register of the AGC feedback loop 122 is set to its least significant bit (LSB). In general, to decrease attenuation, programmable attenuator 600 incrementally advances the set of activated switches from a tap providing more attenuation to a tap providing less attenuation. To increase attenuation, programmable attenuator 600 incrementally advances the set of activated switches from the tap providing less attenuation to the tap providing more attenuation. The register of the AGC feedback loop 122 may be incremented until the register of the AGC feedback loop 122 is set to its most significant bit (MSB).

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A programmable attenuator, comprising:
   a resistor ladder having a plurality of taps;
   a plurality of switch banks, each switch bank including a plurality of switches having a common input coupled to a corresponding tap on the resistor ladder and an output coupled to an output of the programmable attenuator; and
   control logic to control operation of the plurality of switches.

2. The programmable attenuator of claim 1, wherein the resistor ladder further comprises:
   a first tap to provide a first tap attenuation level; and
   a second tap to provide a second tap attenuation level, wherein the second tap attenuation level is greater than the first tap attenuation level by a predetermined tap attenuation amount.

3. The programmable attenuator of claim 2, wherein the control logic activates a first group of switches to form a set of activated switches and deactivates a second group of switches to form a set of deactivated switches.

4. The programmable attenuator of claim 3, wherein the set of activated switches is completely located within a switch bank among the plurality of switch banks.

5. The programmable attenuator of claim 3, wherein the set of activated switches is located within more than one switch bank among the plurality of switch banks.

6. The programmable attenuator of claim 5, wherein the more than one switch bank is located adjacent to each other.

7. The programmable attenuator of claim 1, wherein the resistor ladder is an R-2R resistor ladder.

8. The programmable attenuator of claim 1, wherein the resistor ladder is a differential resistor ladder.

9. The programmable attenuator of claim 1, wherein the plurality of switches are Complementary Metal Oxide Semiconductor (CMOS) transistors.

10. The programmable attenuator of claim 1, wherein the control logic comprises:
an automatic gain control (AGC) feedback loop.

11. The programmable attenuator of claim 1, wherein the control logic comprises:
a register to generate a control word to individually control the plurality of switches.

12. The programmable attenuator of claim 1, wherein the control logic applies a corresponding bit from a code to a corresponding control terminal of each of the plurality of switches to control the operation of the plurality of switches.

13. The programmable attenuator of claim 1, wherein the plurality of switches are transistors, each of the transistors including a source terminal, the source terminal from each of the transistors being connected to form the common input.

14. In a programmable attenuator, having a resistor ladder with a plurality of taps, a plurality of switch banks, each switch bank including a plurality of switches having a common input coupled to a corresponding tap on the resistor ladder and an output coupled to an output of the programmable attenuator, and control logic to control the operation of the plurality of switches, wherein the control logic activates a first group of switches to form a set of activated switches and deactivates a second group of switches to form a set of deactivated switches, a method comprising:
interpolating attenuation between a first tap and a second tap, wherein the attenuation level of the second tap is greater than the attenuation level of the first tap by activating a switch in the set of inactive switches and deactivating another switch in the set of active switches.

15. The method of claim 14, further comprising:
activating a switch in the set of inactive switches and deactivating another switch in the set of active switches to increase an attenuation level of the programmable attenuator.

16. The method of claim 14, further comprising:
activating a switch in the set of inactive switches and deactivating another switch in the set of active switches to decrease an attenuation level of the programmable attenuator.

17. A direct conversion receiver, comprising:
a programmable attenuator including,
a resistor ladder having a plurality of taps,
a plurality of switch banks, each switch bank including a plurality of switches having a common input coupled to a corresponding tap on the resistor ladder and an output coupled to an output of the programmable attenuator, and
control logic to control the operation of the plurality of switches;
a local oscillator generating an in phase signal and a quadrature phase signal;
a first mixer coupled to the local oscillator to down convert an input using the in phase signal; and
a second mixer coupled to the local oscillator to down convert the input using the quadrature signal.

18. The direct conversion receiver of claim 17 further comprising:
a second programmable attenuator coupled to the first mixer, wherein the second programmable attenuator comprises:
a resistor ladder having a plurality of taps, wherein each one of the plurality of taps includes a plurality of switches having a common input coupled to the each one of the plurality of taps and an output coupled to an output of the programmable attenuator; and
control logic to control the operation of the plurality switches; and
a third programmable attenuator coupled to the second mixer, wherein the third programmable attenuator comprises:
a resistor ladder having a plurality of taps, wherein each one of the plurality of taps includes a plurality of switches having a common input coupled to the each one of the plurality of taps and an output coupled to an output of the programmable attenuator; and
control logic to control the operation of the plurality switches.

19. The direct conversion receiver of claim 17, wherein the first resistor ladder further comprises:
a first tap to provide a first tap attenuation level; and
a second tap to provide a second attenuation level, wherein the second tap attenuation level is greater than the first tap attenuation level by a predetermined tap attenuation amount.

20. The direct conversion receiver of claim 19, wherein the control logic activates a first group of switches to form a set of activated switches and deactivates a second group of switches to form a set of deactivated switches.

21. The direct conversion receiver of claim 20, wherein the set of activated switches is completely located within one switch bank among the plurality of switch banks.

22. The direct conversion receiver of claim 20, wherein the set of activated switches is located within multiple switch banks among the plurality of switch banks.

23. The direct conversion receiver of claim 22, wherein the multiple switch banks are adjacent to each other.

* * * * *

UNITED STATES PATENT AND TRADEMARK OFFICE
CERTIFICATE OF CORRECTION

PATENT NO.        : 7,660,571 B2                                  Page 1 of 1
APPLICATION NO. : 11/588264
DATED             : February 9, 2010
INVENTOR(S)       : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 560 days.

Signed and Sealed this

Twenty-eighth Day of December, 2010

David J. Kappos
*Director of the United States Patent and Trademark Office*